US006124726A

United States Patent [19]

Dohnal et al.

[11] Patent Number: 6,124,726

[45] Date of Patent: Sep. 26, 2000

[54] METHOD OF MONITORING A TAP SELECTOR

[75] Inventors: Dieter Dohnal, Lappersdorf; Manfred Stadelmayer, Wenzenbach; Karsten Viereck, Diesenbach, all of Germany

[73] Assignee: Maschinenfabrik Reinhausen GmbH, Regensburg, Germany

[21] Appl. No.: 09/168,008

[22] Filed: Oct. 7, 1998

[30] Foreign Application Priority Data

Oct. 8, 1997 [DE] Germany ........................... 197 44 465

[51] Int. Cl.[7] ............................ G01R 31/02; G05F 1/147

[52] U.S. Cl. ............................................ 324/772; 323/341

[58] Field of Search ..................................... 324/772, 527; 361/3, 5, 7; 323/341; 702/57, 58; 340/644, 646, 650, 651, 652; 700/292, 293

[56] References Cited

U.S. PATENT DOCUMENTS

| | | | |
|---|---|---|---|
| 3,515,980 | 6/1970 | Throop | 323/341 |
| 3,602,807 | 8/1971 | Prescott | 361/3 |
| 4,090,225 | 5/1978 | Gilker et al. | 323/341 |

FOREIGN PATENT DOCUMENTS

| | | |
|---|---|---|
| 246 409 | 6/1987 | Germany . |
| 60-176213 | 2/1984 | Japan . |

OTHER PUBLICATIONS

Maschinenfabrik Reinhausen, Microprocessor Controlled Voltage Regulating Relay TCS, Oct. 1995, pp. 2 to 12.

Maschinenfabrik Reinhausen, Mikroprozessorgesteuerter Spannungsregler TCS, Aug. 1996, pp. 2 to 12.

*Primary Examiner*—Ernest Karlsen
*Attorney, Agent, or Firm*—Herbert Dubno

[57] ABSTRACT

A tap selector for a power transformer switchable under load is monitored by detecting the effective values of current and voltage of the drive motor of the tap changer. The power is calculated and from that the instantaneous torque and the latter is compared with setpoint values either of the torque and position of the tap selector or in terms of characteristic segments of the torque versus time graph with normalized segments of a setpoint graph so that, with serious deviation an immediate shutdown of tap selector operations is ensured or information can be generated as to trends or the need for maintenance.

10 Claims, 4 Drawing Sheets

METHOD OF MONITORING A TAP SELECTOR

FIELD OF THE INVENTION

Our present invention relates to a method of monitoring a tap selector for the interruption-free switching between taps of a tapped transformer.

BACKGROUND OF THE INVENTION

The use of tapped transformers to control the voltage delivered to a load is widespread in power supply systems where the load may be a network delivering local electric power and the tapped transformer can be provided at a transformer station between the power-generating unit and the local network or between power transmission lines from a power-generating source to the local network.

The tap selector can comprise an electric motor-driven set of movable tap selector contacts which are caused to engage fixed tap selector contacts associated with the taps of a power transformer, and associated drives also operated by that electric motor for synchronously with the tap selection displacement, can operate bypass switch contacts, mechanisms for tripping vacuum-switching cells and even contacts for coarse selection of a tap range for reversing contacts. Reference may be had to the commonly-owned copending application Ser. No. 09/165,494, filed Oct. 2, 1998, now U.S. Pat. No. 6,060,669, corresponding to German application 197 43 864.4 filed Oct. 4, 1997.

In that system the electric motor driven by the tap selector, not only drives the shaft connected with the tap selector contacts, but also drives a shaft connected with the bypass contacts and a shaft operating the vacuum-switching cells for each of the phases of the system to be switched.

A typical operation of such a switch will have, in shifting from a tap n to a tap n+1, a pair of movable selector contacts which, in a previous state both rest upon the fixed contact corresponding to the tap n. Each of these movable contacts may be connected to a switching impedance, e.g. a coil. At the opposite ends, the coils may be bridged by a vacuum-switching cell having a mechanism that can be rapidly tripped to open-circuit that cell and a cam mechanism to close electrically the vacuum-switching cell. Through a pair of bypass contacts, the ends of the impedances bridged by the vacuum-switching cell are connected to the load.

In a typical switching operation, driven by the electric motor, with the two movable contacts of the tap selector on the fixed contact of the preceding tap n, the bypass contact of the impedance associated with the leading selector contact is opened, followed by open-circuiting of the vacuum-switching cell and shifting of the movable contacts of the tap selector to bring the leading movable contact into engagement with the fixed contact of an adjacent transformer step n+1. The vacuum-switching cell is then closed followed by closing of the bypass contact so that the tap selector movable contacts bridge the adjacent fixed contacts of the respective taps. The bypass contact of the upstream tap selector contact can then be opened, followed by open-circuiting of the vacuum-switching cell and the trailing tap selector contact moved onto the fixed contact for tap n+1, whereupon bypass contacts and the vacuum-switching cell are then closed as has been described. With this sequence, an interruption-free switching can be accomplished with a minimum of contact wear and burn off even under load.

In German patent document 42 14 431, a motor drive for such a tap selector has already been described and it has been suggested that information with respect to that motor drive can serve to indicated the position of the tap selector during a tap-selection operation. In fact in this system information is derived with respect to the tap selector setting, the attainment of respective upper and lower end positions, the mode of operation selected and the triggering of the motor protection switch which is generally designed to prevent overloading of the motor. In practice, however, this information has not been found sufficient to provide a satisfactory monitoring function for the operation of the tap selector. In the brochure entitled Microprocessor Controlled Voltage Regulator TCS, publication VK 34/96 DE-0896/1000, issued by Maschinenfabrik Reinhausen GmbH, the present assignee, the microprocessor-controlled voltage regulator is described which can achieve a monitoring function which includes:

- monitoring of the circular-blind current between two parallel-switched transformers,
- the achievement of over-current blocking for the tap selector,
- the under-voltage monitoring,
- an over-voltage monitoring with safety shut-off, and
- a setpoint and actual value comparison of the controlled voltage.

Even in this system data is not obtained which allows a direct monitoring of the operating state of the tap selector. The input parameters here are only currents and voltages which without additional information and without special information processing, cannot provide a suitable indication of the operating state.

Japanese patent application JP 60 176213 A has described the detection of the torque of the drive shaft which runs from the electric motor drive to the tap selector and the storage of this torque so that the instantaneous torque curve can be compared with a characteristic type-specific setpoint torque curve. A similar process is described in East German patent DD 246 409 in which the torque curve over times is measured in a tap selection operation and the result is compared with a typical torque curve as a function of time for the respective tap selector. Should an impermissible deviation of the actual value from the setpoint value be determined, shutdown will occur. However, because of the difficulty in detecting the torque, these processes have not found significant use in practice.

Mention should also be made of prior proposals whereby the respective torque is not determined directly by mechanical measuring means but rather is detected indirectly by a detection of the efficiency of the drive motor which produces that torque. Even this approach has not found significant use in practice heretofore.

OBJECTS OF THE INVENTION

It is therefore the principal object of the present invention to provide a method of monitoring a tap selector which is more effective than earlier methods of monitoring and which can allow in an economical and convenient manner the monitoring via the electric drive motor without the drawbacks of earlier systems necessitating a mechanical torque measurement or the like.

Still another object of the invention is to provide a method of monitoring the operation of a tap selector which utilizes electrical parameters which are easy to obtain to facilitate the monitoring of the tap selector and to detect deviations in operation of the latter from a norm through the detection of defects for such parameters.

It is also an object of the invention to provide an improved method of monitoring a tap selector whereby drawbacks of earlier systems are avoided.

SUMMARY OF THE INVENTION

These objects are attained in a method of monitoring a tap selector for interruption-free selection of voltage taps of a power transformer under load which comprises the steps of:

(a) displacing the tap selector with an electric drive motor and during tap-selection operation of the electric drive motor measuring effective values of voltage applied to and current drawn by the electric drive motor;

(b) automatically calculating true power of the electric drive motor from the effective values of voltage applied to and current drawn by the motor as measured in step (a) and determining a torque developed by the motor from the calculated true power;

(c) simultaneously with the determination of the torque developed by the motor, generating a position value representing an actual setting of the tap selector and thereby forming a corresponding pair of determined values of developed torque and tap-selector setting;

(d) comparing the pairs of determined values with previously stored apparatus-specific setpoint pairs of corresponding values, optionally corrected for ambient temperature; and (e) upon deviation of a determined value pair from a setpoint value pair exceeding a predetermined threshold difference, generating a signal for inactivating the drive of the tap selector or initiating a maintenance operation thereof.

According to a feature of the invention the position value is determined continuously in step (c) by a resolver. The method also may allow for correction of at least one further parameter in the comparison of step (d), this parameter being the temperature of a tap selector oil, the temperature of the transformer oil or the temperature of the ambient air, or contact burn-up.

Another way of defining this method of the invention is by the steps of:

(a) displacing the tap selector with an electric drive motor and during tap-selection operation of the electric drive motor measuring effective values of voltage applied to and current drawn by the electric drive motor;

(b) automatically calculating true power of the electric drive motor from the effective values of voltage applied to and current drawn by the motor as measured in step (a) and determining a torque developed by the motor from the calculated true power;

(c) simultaneously with the determination of the torque developed by the motor, generating a position value representing an actual setting of the tap selector;

(d) storing values of the determined torque as a function of time;

(e) synchronizing tap selection under load with stored values of determined torque as a function of time by generating at least one synchronization pulse at a characteristic state of tap selection corresponding to a certain point in time ($t_{syn}$);

(f) thereafter detecting a normalized course of the torque of the motor in a typical time range ($t_0$–$t_1$, . . . , $t_{syn}$–$t_n$) forming a determined window corresponding to a switch-specific part of the tap-change sequence;

(g) comparing the determined window ($t_0$–$t_1$, . . . , $t_{syn}$–$t_n$) with a stored setpoint value of the window; and (h) upon deviation of a determined window from the setpoint window exceeding a predetermined threshold difference, generating a signal for inactivating the drive of the tap selector or initiating a maintenance operation thereof.

The invention provides a simple way of monitoring a tap selector during the entire period for tap selection, i.e. over the entire interval for which the motor drive for the tap selector is actuated. It allows in a simple manner the development of a torque curve for the entire process or critical parts of the torque curve a response to these critical parts. The system allows monitoring of the individual components of the tap changer, like the preselector or range selector switch or reversing switch, the tap-to-tap fine selector switch, the load side or bypass switching and the vacuum-switching cell operation since these are normally operated in a sequence as has been described and will reflect differences in the torque in the course of a single tap selection operation.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
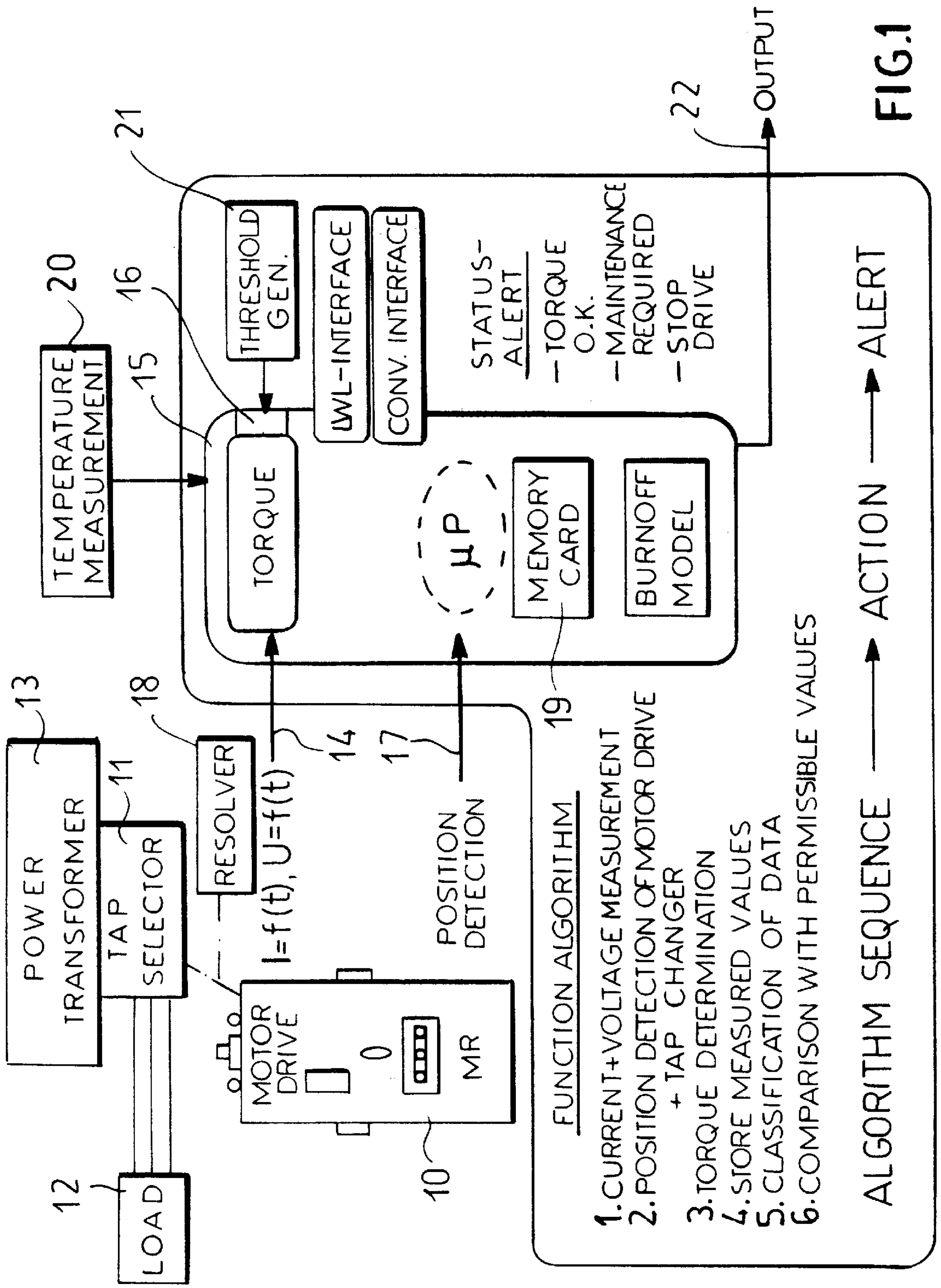
FIG. 1 is a schematic illustration of the system of the invention showing the steps in the process of the invention.

As can be seen from FIG. 1, a motor drive unit 10, complete with an electric motor and in stepped down transmission which may be desirable, is connected to the tap selector 11 which serves to connect a load 12 with a power transformer of the stepped or tapped type. Usually the tap selector makes use of a set of movable and fixed contacts for stepping up or stepping down the tap selection, movable and fixed contacts for the bypass switching, a triggerable vacuum-switching cell for each phase of the system and switching impedances. Reference may be had to U.S. Pat. No. 6,060,669.

Change under load and as shown at 14 the current and voltage of the motor are measured so that in the microprocessor-based controller 15, the effective power and from that the instantaneous torque can be calculated. The calculation of the torque is represented at 16.

Simultaneously at 17, the position of the motor drive is determined, i.e. the position of the motor as a function of times is registered for each instant of the tap change sequence. This position, of course, represents the positions of the various components, like the preselector switches, the tap-change switches and the bypass switches as well as of the mechanism for tripping the vacuum-switching cells and the like. The tap-changing switches and bypass switches are actuated in accordance with a switching sequence similar to that described above. The position detection is effected preferably by means of a resolver which allows a continuous position to be measured. Such a resolver has been shown diagrammatically at 18 in FIG. 1.

Using this system, the following sequence of steps is carried out:

Firstly, during a tap change under load with energization of the electric motor, the effective values of the motor current and the voltage applied to the drive motor are measured. Secondly, from these values, the efficiency of the motor is calculated and from the efficiency the torque is determined and that allows the microprocessor circuitry to graph the torque as the function of time. Thirdly, simultaneously, the position of the electric motor as a function of time is inputted to the microprocessor.

Fourthly, the instantaneous torque is compared with the instantaneous position to provide a pair of values at each time interval.

Fifthly, these value pairs are compared with previously stored setpoint value pairs, e.g., via the memory card 19. The setpoint values can have previously been corrected for ambient temperature measurement at 20.

Upon deviation of the compared value pairs, in the sixth step, when the deviation exceeds a predetermined threshold inputted by a threshold changer 21 or preprogrammed in the microprocessor circuit 15, an input is generated at 22 in the form of a signal which shuts sown the motor drive and brings the tap selector to standstill or displays a signal to the effect that maintenance is required.

In the alternative method described, the first process stages are also carried out. In other words during the tap selection under load, the effective values of voltage and current at the drive motor of the drive for the tap selector are detected and from these values the efficiency and hence the torque are ascertained. Even in this system a position detection for the actual position of the step switch and its parts is made.

Here, however, in the fourth step, the value of the torque as a function of time is stored. A synchronization is effected by a synchronization pulse which is generated when a characteristic state of the tap change operation is registered coincides with a predetermined point in time ($t_{syn}$), for example, the triggering of the force-storing devices which operate the vacuum-switching cells. In the next or fifth step, the normalized graph of the torque in a typical time range ($t_0$–$t_1$ . . . $t_{syn}$–$t_n$) is separated out to correspond to a predetermined tap changer-specific part of the switching sequence. Finally this time range or so-called window is compared with predetermined characteristic setpoint values of the course of the torque expected for the various phases.

Once this comparison is made, any differences if they exceed the predetermined threshold, generate warning signals which are intended to trigger maintenance activities and shut down the motor drive. As a consequence, each measured torque as a function of time corresponds to an angular position of the tap change and an actual value of the torque can be generated usually at short intervals, for example, every 20 ms. The torque value is stored preferably in a ring buffer. Based upon the recorded torque, synchronization can be effected by means of a synchronization pulse which can represent the beginning of a characteristic operation, for example, a particular stage in the tap selection sequence or the start thereof. This point in time at which synchronization occurs has been identified by the symbol $t_{syn}$.

It has been found to be especially effective to use $t_{syn}$ as the instant that the force-storing mechanisms for the vacuum-switching cells are triggered. In this case, the triggering of the force-storing units effects a jump response in the tap selector and is most useful as a measurement. For example, it can be detected like transients are detected in conventional power systems.

Figure 2A:
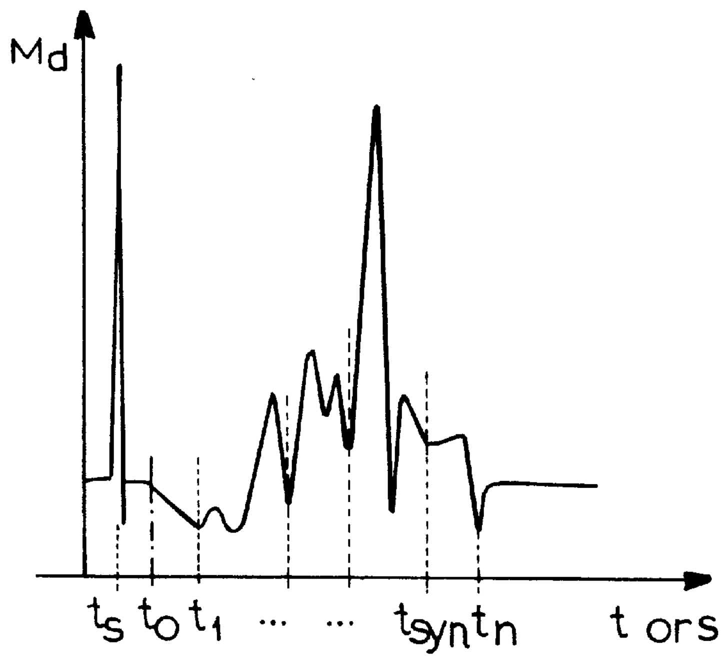
FIGS. 2*a* and 2*b* are two typical torque graphs with time showing the torque on the motor drive for the tap changer as the latter is stepped up and stepped down, respectively for higher and lower voltages applied to the load.
Figure 2B:
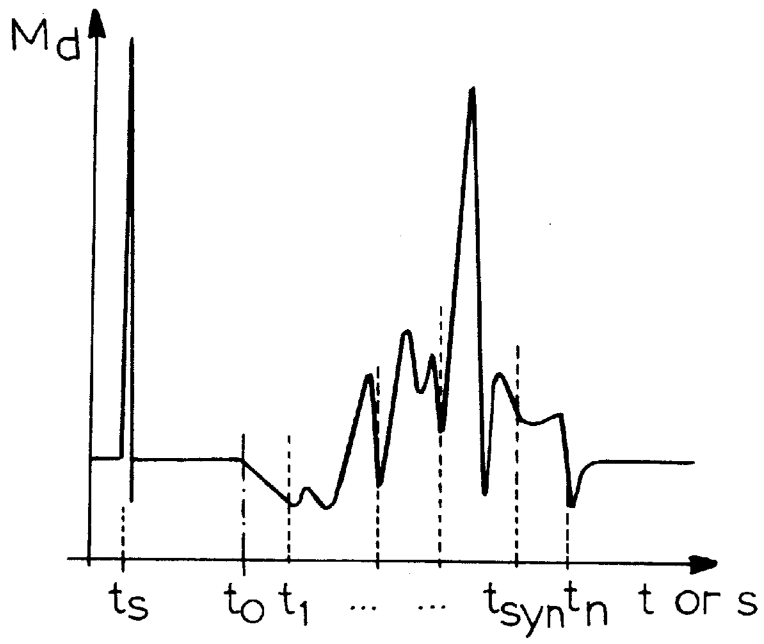

The advantage of this process which has been diagrammed in FIGS. 2*a* and 2*b* will be apparent from the description of these Figrues. FIG. 2*a* shows a measured torque graph with time t or with the displacement s of the tap changer in one tap change operation. The graph 2*b* represents the measured torque as a function of time or displacement in the opposite sense, i.e. with rotation of the drive shaft of the tap changer by the motor thereof in the opposite direction (e.g. tap step down rather than step up). Because of mechanical tolerances or hysteresis and lost motion and like effects, the characteristic parts of the curve have difference occurrence times following start of the drive motor at time $t_s$. The first characteristic point of the torque graph can be seen at the time $t_0$.

The corresponding graphs are not, of course, directly comparable and must first be normalized as to time. This is achieved by the synchronization described previously.

With this second process according to the invention, the synchronized torque graph has characteristic parts, which are so-called windows, which themselves are comparable to characteristic parts of the previously recorded setpoint graph. Thus each window represents one characteristic part of the respective tap change sequence and such windows can represent not only an interval in the tap change operation by the find selector contacts but also the operation of the bypass contacts and even the characteristic of the cross or reversing selector contacts. Each window is in turn bounded by two characteristic points in time which establish the beginning and end of the respective window, for example: $t_0$–$t_r$, $t_1$ . . . , . . . , $t_{syn}$–$t_n$.

Each of these windows can be compared with the previously stored characteristic setpoint values. Because of the actual value of this selective mode of comparison, the deviation from the setpoint value of the torque and detection of an error, can be readily established but it is possible to determine in which group of components the defect has arisen so that, for maintenance purposes, the maintenance personnel can be alerted not only to a defect in the tap selection operation but where to seek the defect in the tap selector. Apart from the described selective error detection, the system of the invention allows also trend analysis as to the mechanical components.

In addition it is also possible in accordance with both modes of the invention to provide a maximum value for the torque which, when exceeded, will result in shutdown of the drive independently of other criteria.

Figure 3:
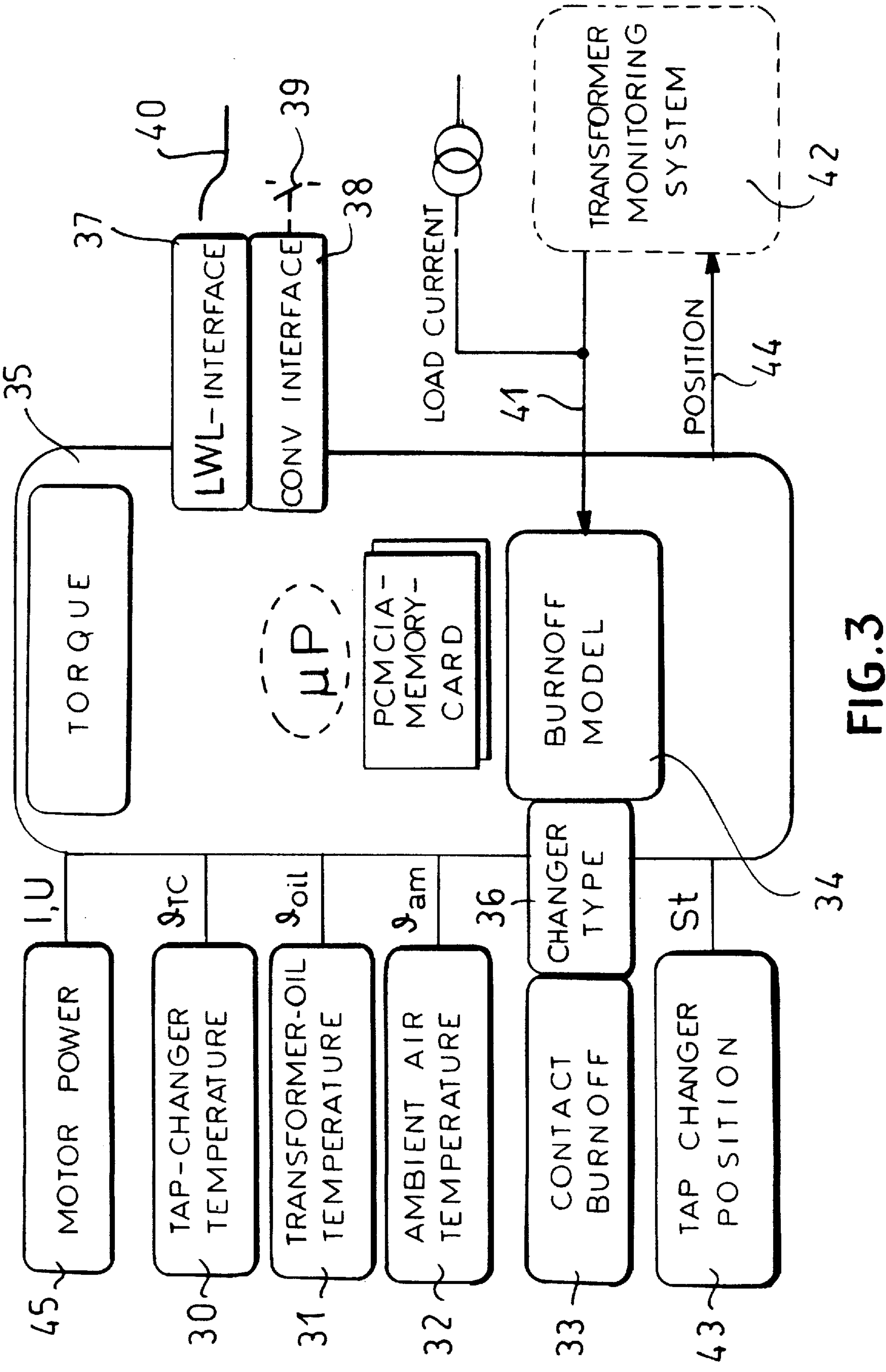
FIG. 3 is a diagram of another system of the type shown in FIG. 1 with additional parameters and models.

According to another feature of the invention, it is possible to monitor other parameters as well as has been illustrated in FIG. 3. Here in addition to detection of the motor power and hence the torque on the one hand and the detection of the position of the tap selector on the other, we may measure the temperature of the insulating medium in the tap selector switch at 30, the temperature of the transformer oil at 31, the ambient temperature at 32 and, if desired, contact burn off at 33 which can be compared with a burn-off model stored at 34 in the microprocessor circuit 35, the comparison being based upon the tap selector type which is inputted at 36. The interfaces to the circuit 35 are represented at 37 and 38 and serve to open-circuit the motor via the switch 39 and to provide an output at 40 indicating the need for maintenance or the like. A load current input can be provided at 41 from the transformer monitoring circuit 42 while the position input is provided at 43 as has been described, the motor output to the transformer tap changer being represented here at 44. The inputs for providing the motor power are generated at 45 in this embodiment.

Figure 4:
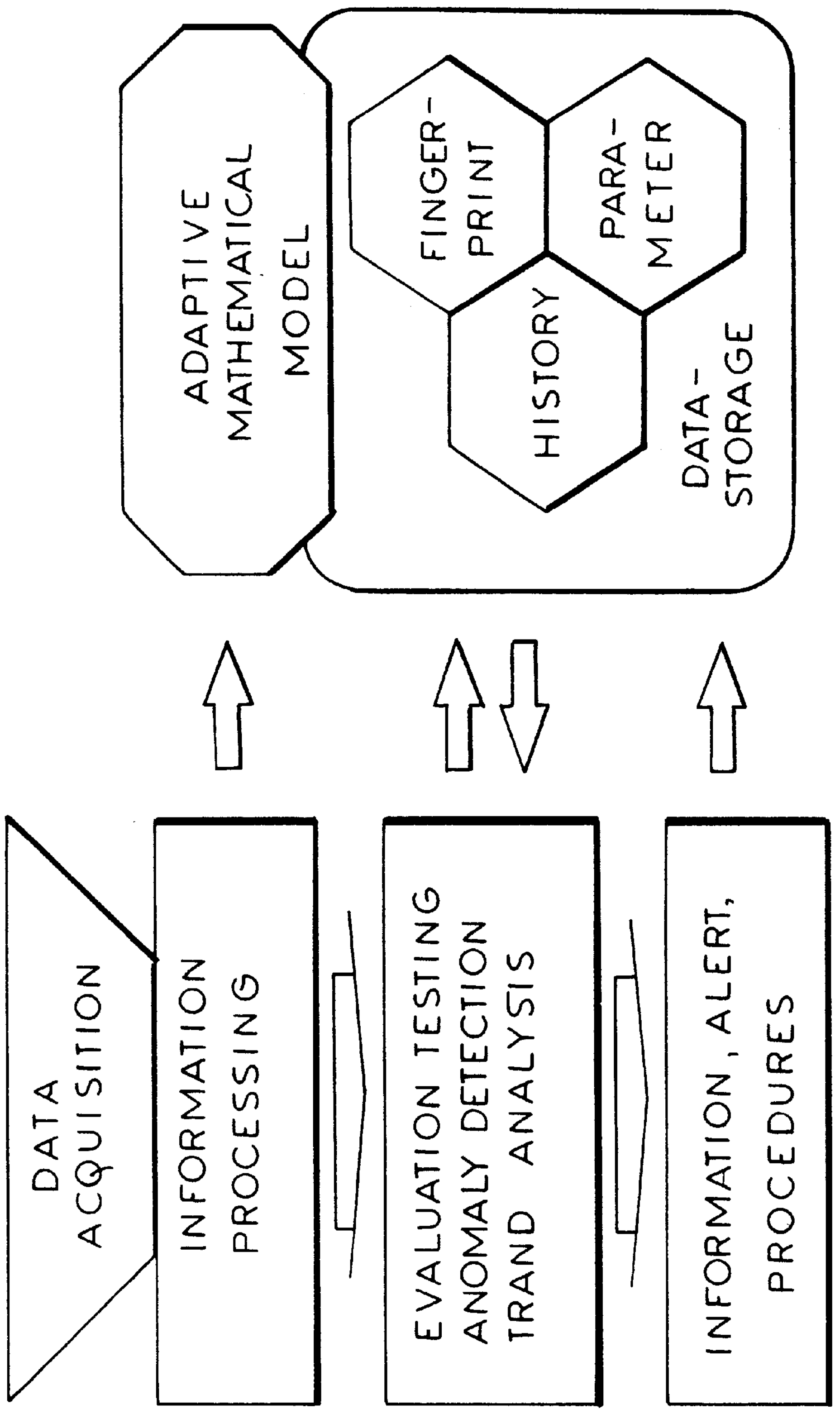
FIG. 4 is an information flow diagram of the monitoring stages.

The information flow diagram of the process is shown in FIG. 4 and, as has been described, characteristic measured values like current and voltage from the motor are detected and subjected to the information processing to generate the instantaneous power and hence the actual torque generated by the motor. The torque information is evaluated in the manner described, checked and anomalies detected and trend analysis generated based upon an adaptive mathematical model programmed into the microprocessor with its data storage unit. Information and alert signals are generated which can be outputted depending upon the priority. With significant deviations from respective setpoints, an instantaneous shutdown can be ensured, for example, when the torque during the tap change operation is equal to or in excess of some absolute limiting setpoint value. Upon the detection of deviations in uncritical ranges which do not rank with challenges to reliability or safety, information is outputted which can enable maintenance to increase the life of the apparatus and to alert the operators as to trends.

We claim:

1. A method of monitoring a tap selector for interruption-free selection of voltage taps of a power transformer under load, comprising the steps of:

(a) displacing the tap selector with an electric drive motor and during tap-selection operation of said electric drive motor measuring effective values of voltage applied to and current drawn by said electric drive motor;

(b) automatically calculating true power of said electric drive motor from the effective values of voltage applied to and current drawn by said motor as measured in step (a) and determining a torque developed by said motor from the calculated true power;

(c) simultaneously with the determination of the torque developed by said motor, generating a position value representing an actual setting of the tap selector and thereby forming a corresponding pair of determined values of developed torque and tap-selector setting;

(d) comparing said pairs of determined values with previously stored apparatus-specific setpoint pairs of corresponding values, optionally corrected for ambient temperature; and (e) upon deviation of a determined value pair from a setpoint value pair exceeding a predetermined threshold difference, generating a signal for inactivating the drive of the tap selector or initiating a maintenance operation thereof.

2. The method defined in claim 1 wherein said position value is determined continuously in step (c) by a resolver.

3. The method defined in claim 2, further comprising the step of correcting for at least one further parameter in the comparison of step (d).

4. The method defined in claim 3 wherein the further parameter is a temperature of a tap-selector oil, the transformer oil or the ambient air.

5. The method defined in claim 3 wherein the further parameter is contact burn-up.

6. A method of monitoring a tap selector for interruption-free selection of voltage taps of power transformer under load, comprising the steps of:

(a) displacing the tap selector with an electric drive motor and during tap-selection operation of said electric drive motor measuring effective values of voltage applied to and current drawn by said electric drive motor;

(b) automatically calculating true power of said electric drive motor from the effective values of voltage applied to and current drawn by said motor as measure in step (a) and determining a torque developed by said motor from the calculated true power:

(c) simultaneously with the determination of the torque developed by said motor, generating a position value representing an actual setting of the tap selector;

(d) storing values of the determined torque as a function of time;

(e) synchronizing tap selection under load with stored values of determined torque as a function of time by generating at least one synchronization pulse at a characteristic state of tap selection corresponding to a certain point in time ($t_{syn}$);

(f) thereafter detecting a normalized course of the torque of the motor in a typical time range ($t_0$–$t_1$, . . . , $t_{syn}$–$t_n$) forming a determined window corresponding to a switch-specific part of the tap-change sequence;

(g) comparing said determined window ($t_0$–$t_1$, . . . , $t_{syn}$–$t_n$) with a stored setpoint value of the window; and (h) upon deviation of a determined window from the setpoint window exceeding a predetermined threshold difference generating a signal for inactivating the drive of the tap selector or initiating a maintenance operation thereof.

7. The method defined in claim 6 wherein said position value is determined continuously in step (c) by a resolver.

8. The method defined in claim 6, further comprising the step of correcting for at least one further parameter in the comparison of step (g).

9. The method defined in claim 8 wherein the further parameter is a temperature of a tap-selector oil, the transformer oil or the ambient air.

10. The method defined in claim 8 wherein the further parameter is contact burn-up.

* * * * *